United States Patent
Huynh

(10) Patent No.: US 8,717,212 B2
(45) Date of Patent: May 6, 2014

(54) BANDPASS-SAMPLING DELTA-SIGMA DEMODULATOR

(71) Applicant: Phuong Huynh, Fairfax, VA (US)

(72) Inventor: Phuong Huynh, Fairfax, VA (US)

(73) Assignee: Phuong Huynh, Fairfax, VA (US)

( * ) Notice: Subject to any disclaimer, the term of this patent is extended or adjusted under 35 U.S.C. 154(b) by 15 days.

(21) Appl. No.: 13/623,350

(22) Filed: Sep. 20, 2012

(65) Prior Publication Data

US 2014/0077978 A1 Mar. 20, 2014

(51) Int. Cl.
*H03M 3/00* (2006.01)

(52) U.S. Cl.
USPC .......... 341/143; 370/389; 375/327; 375/316; 375/243; 375/244; 375/346; 455/181.1; 455/307; 455/230; 455/234.2; 455/161.1; 341/144; 341/147; 341/149; 341/152; 341/154

(58) Field of Classification Search
USPC .......... 341/135–160; 375/327, 316, 243, 244, 375/247, 346, 343; 370/389; 455/181.1, 455/3.2, 307, 161.1, 161.2, 230, 232.1, 455/234.2
See application file for complete search history.

(56) References Cited

U.S. PATENT DOCUMENTS

| | | | |
|---|---|---|---|
| 5,841,388 A | 11/1998 | Yasuda et al. | |
| 5,953,636 A | 9/1999 | Keate et al. | |
| 6,275,540 B1 | 8/2001 | Barrett, Jr. et al. | |
| 7,324,615 B2 | 1/2008 | Lourens et al. | |
| 7,355,535 B1 * | 4/2008 | Anderson et al. | 341/106 |
| 7,436,911 B2 * | 10/2008 | Fudge et al. | 375/340 |
| 7,436,912 B2 * | 10/2008 | Fudge et al. | 375/340 |
| 7,446,692 B2 * | 11/2008 | Volnhals | 341/155 |
| 7,489,745 B2 * | 2/2009 | Fudge | 375/340 |
| 7,714,760 B2 * | 5/2010 | Petrovic | 341/155 |
| 7,852,251 B2 * | 12/2010 | Volnhals | 341/161 |
| 8,121,222 B2 * | 2/2012 | Boyle et al. | 375/316 |
| 8,249,129 B2 * | 8/2012 | Fudge | 341/152 |
| 8,509,353 B2 * | 8/2013 | Han et al. | 341/143 |
| 2003/0021367 A1 | 1/2003 | Smith | |
| 2005/0069056 A1 | 3/2005 | Willingham | |
| 2006/0007929 A1 | 1/2006 | Desai et al. | |
| 2007/0060077 A1 * | 3/2007 | Qian | 455/130 |
| 2008/0025437 A1 * | 1/2008 | Huynh | 375/324 |
| 2008/0026717 A1 * | 1/2008 | Huynh | 455/266 |

\* cited by examiner

*Primary Examiner* — Lam T Mai

(57) ABSTRACT

An improved quadrature bandpass-sampling delta-sigma analog-to-digital demodulator is provided, which includes a loop filter, an A/D responsive to the loop filter, and a first feedback D/A responsive to the A/D up-converted in frequency by a first multiplier and a clock. A first summing circuit is responsive to the first D/A and an RF input for providing an input to the loop filter. A plurality of feedback D/As is responsive to the A/D up-converted in different frequencies by a plurality of multipliers and a plurality of clocks for providing feedback inputs to the loop filter. The loop filter comprises a plurality of resonators arranged in cascade configuration, a plurality of analog mixers to provide frequency shifting of the error signals propagating through the resonators, and a plurality of summing circuits responsive to the feedback D/As.

27 Claims, 5 Drawing Sheets

BANDPASS-SAMPLING DELTA-SIGMA DEMODULATOR

FIELD OF THE INVENTION

The present invention relates in general analog-to-digital conversion in communication systems. More specifically, the invention relates to analog-to-digital demodulation of a signal at radio frequencies in a communication system.

BACKGROUND OF THE INVENTION

Wireless systems are becoming a fundamental mode of telecommunication in modern society. In order for wireless systems to continue to penetrate into the telecommunications market, the cost of providing the service must continue to decrease and the convenience of using the service should continue to increase. In response to increasing market demand, radio standards around the world have been proliferated based upon digital modulation schemes. Consequently, it is often advantageous to have a receiver that is capable of communication using more than one of these standardized techniques. In order to do so, it is necessary to have a receiver that is capable of receiving signals which have been modulated according to several different modulation techniques.

Advancement in semiconductor process technologies allows usage of oversampling bandpass delta-sigma analog-to-digital conversion in the RF frequencies, which is a new promising low-cost and reliable technique to digitize RF signals. The delta-sigma converter comprises a bandpass filter, which consists of a series of resonators in cascade, an analog-to-digital converter (A/D), that generates the converted digital output signal, and a digital-to-analog converter (D/A) that produces a plurality of analog signals converted from the digital output signal to be feed back to the resonator inputs. The first error signal is produced by the difference between the input RF signal and the first feedback signal from the D/A. A first resonator in the filter stage amplifies the first error signal to produce a more refined error signal, which is subtracted from a second feedback signal from the D/A. The sequence is repeated down the resonator stages. The output error signal from the last resonator in the bandpass filter is then sampled by the A/D. The digitized signal is converted to a feedback signal via the D/A. In order to achieve feedback stability, the sampling frequency of the A/D must be at least four times the RF signal frequency, and the digital output reproduces the high-frequency waveform of the input RF signal.

Nevertheless, oversampling an RF signal is not quite practical given the current advancement in process technologies, where the sampling clock rate may exceed tens of gigahertz. The inherent clock jitter in the sampling clock to the A/D, due to thermal agitation at the molecule level that generates phase noise in clock oscillators, severely limits the analog-to-digital conversion resolution. Also, pre-processing of the digitized RF signal requires an impractically high clock rate in the tens of gigahertz range.

SUMMARY OF THE INVENTION

Improvements are sought in this invention to minimize the analog pre-processing by demodulating and digitizing the received signal directly at the RF frequency. It is the object of this invention to reduce the sampling clock rate of the sampling A/D, to the RF signal frequency. Using this 'bandpass-sampling' technique, the sampling A/D not only digitizes the RF signal, but by virtue of the bandpass sampling theory, also demodulates the RF signal to baseband.

This invention features an improved bandpass delta-sigma converter including a circuit for demodulating a radio-frequency signal and providing a digital output signal, comprising first through $N^{th}$ filter stages configured to receive first through $N^{th}$ input signals and first through $N^{th}$ analog feedback signals, respectively, and to generate first through $N^{th}$ corrected output signals; first through $N^{th}$ feedback conversion circuits configured to receive the digital output signal and generate the first through $N^{th}$ analog feedback signals, respectively; an output analog-to-digital converter configured to receive the first corrected output signal and generate the digital output signal, wherein N is an integer greater than 1, wherein each of the first through $N^{th}$ filter stages includes a resonator and a summing junction, wherein each of the first through $(N-1)^{th}$ filter stages includes an analog mixer and a frequency-shifting clock, wherein the resonators in each of the first through $N^{th}$ filter stages have different resonant frequencies, wherein the $N^{th}$ input signal is the radio-frequency signal, and wherein the first through $(N-1)^{th}$ input signals are the second through $N^{th}$ corrected output signals, respectively.

The $N^{th}$ filter stage includes an $N^{th}$ summing junction configured to subtract the $N^{th}$ analog feedback signal from the radio-frequency signal to generate an $N^{th}$ corrected input signal; and an $N^{th}$ resonator, having an $N^{th}$ resonant frequency, configured to receive the $N^{th}$ corrected input signal and to generate the $N^{th}$ corrected output signal, wherein the $N^{th}$ resonator has an $N^{th}$ resonant frequency.

The first through $(N-1)^{th}$ filter stages each include an $i^{th}$ frequency-shifting clock configured to generate an $i^{th}$ frequency-shifting clock signal; an $i^{th}$ analog mixer configured to mix the $(i+1)^{th}$ corrected output signal and the $i^{th}$ frequency-shifting clock signal to generate an $i^{th}$ intermediate signal; an $i^{th}$ summing junction configured to subtract the $i^{th}$ analog feedback signal from the $i^{th}$ intermediate signal to generate the $i^{th}$ corrected input signal; and an $i^{th}$ resonator, having an $i^{th}$ resonant frequency, configured to receive the $i^{th}$ corrected input signal and to generate the $i^{th}$ corrected output signal, wherein i is an index value that varies from 1 to (N−1), and wherein the first through $N^{th}$ resonant frequencies are all different.

As an alternative, the first through $(N-1)^{th}$ filter stages each include an $i^{th}$ summing junction configured to subtract the $i^{th}$ analog feedback signal from the $(i+1)^{th}$ corrected output signal to generate an $i^{th}$ intermediate signal; and an $i^{th}$ frequency-shifting clock configured to generate an $i^{th}$ frequency-shifting clock signal; an $i^{th}$ analog mixer configured to mix the $i^{th}$ intermediate signal and the $i^{th}$ frequency-shifting clock signal to generate the $i^{th}$ corrected input signal; an $i^{th}$ resonator, having an $i^{th}$ resonant frequency, configured to receive the $i^{th}$ corrected input signal and to generate the $i^{th}$ corrected output signal, wherein i is an index value that varies from 1 to (N−1), and wherein the first through $N^{th}$ resonant frequencies are all different.

Furthermore, the first through $N^{th}$ feedback conversion circuits each include an $i^{th}$ digital mixer configured to mix the digital output signal with an $i^{th}$ up-shifting clock, having an $i^{th}$ up-shifting frequency, to generate an $i^{th}$ digital feedback signal; and an $i^{th}$ digital-to-analog converter configured to convert the $i^{th}$ digital feedback signal to the $i^{th}$ analog feedback circuit, wherein i is an index value that varies from 1 to N, and wherein the first through $N^{th}$ up-shifting frequencies are all different.

The invention also features an improved bandpass delta-sigma converter which includes a circuit for demodulating a radio-frequency signal and providing an in-phase digital output signal and a quadrature digital output signal, comprising first through $N^{th}$ filter stages configured to receive first through $N^{th}$ input signals, first through $N^{th}$ in-phase analog feedback signals, and first through $N^{th}$ quadrature analog feedback signals, respectively, and to generate first through $N^{th}$ corrected output signals; first through $N^{th}$ feedback conversion circuits configured to receive the in-phase digital output signal and the quadrature digital output signal, and to generate the first through $N^{th}$ in-phase analog feedback signals and the first through $N^{th}$ quadrature analog feedback signals, respectively; and an output conversion circuit configured to receive the first corrected output signal, an in-phase clock, and a quadrature clock, and to generate the in-phase digital output signal and the quadrature digital output signal, wherein N is an integer greater than 1, wherein each of the first through $N^{th}$ filter stages includes a resonator and a summing junction, wherein each of the first through $(N-1)^{th}$ filter stages includes an analog mixer and a frequency-shifting clock, wherein the resonators in each of the first through $N^{th}$ filter stages have different resonant frequencies, wherein the $N^{th}$ input signal is the radio-frequency signal, wherein the first through $(N-1)^{th}$ input signals are the second through $N^{th}$ corrected output signals, respectively, and wherein the quadrature clock is ninety degrees out of phase with the in-phase clock.

The $N^{th}$ filter stage includes an $N^{th}$ summing junction configured to subtract the $N^{th}$ in-phase analog feedback signal and the $N^{th}$ quadrature analog feedback signal from the radio-frequency signal to generate an $N^{th}$ corrected input signal; and an $N^{th}$ resonator, having an $N^{th}$ resonant frequency, configured to receive the $N^{th}$ corrected input signal and to generate the $N^{th}$ corrected output signal.

The first through $(N-1)^{th}$ filter stages each include an $i^{th}$ frequency-shifting clock configured to generate an $i^{th}$ frequency-shifting clock signal; an $i^{th}$ analog mixer configured to mix the $(i+1)^{th}$ corrected output signal and the $i^{th}$ frequency-shifting clock signal to generate an $i^{th}$ intermediate signal; an $i^{th}$ summing junction configured to subtract the $i^{th}$ in phase analog feedback signal and the $i^{th}$ quadrature analog feedback signal from the $i^{th}$ intermediate signal to generate the $i^{th}$ corrected input signal; and an $i^{th}$ resonator, having an $i^{th}$ resonant frequency, configured to receive the $i^{th}$ corrected input signal and to generate the $i^{th}$ corrected output signal, wherein i is an index value that varies from 1 to $(N-1)$, and wherein the first through $N^{th}$ resonant frequencies are all different.

As an alternative, the first through $(N-1)^{th}$ filter stages each include an $i^{th}$ summing junction configured to subtract the $i^{th}$ in phase analog feedback signal and the $i^{th}$ quadrature analog feedback signal from the $(i+1)^{th}$ corrected output signal to generate an $i^{th}$ intermediate signal; and an $i^{th}$ frequency-shifting clock configured to generate an $i^{th}$ frequency-shifting clock signal; an $i^{th}$ analog mixer configured to mix the $i^{th}$ intermediate signal and the $i^{th}$ frequency-shifting clock signal to generate the $i^{th}$ corrected input signal; an $i^{th}$ resonator, having an $i^{th}$ resonant frequency, configured to receive the $i^{th}$ corrected input signal and to generate the $i^{th}$ corrected output signal, wherein i is an index value that varies from 1 to $(N-1)$, and wherein the first through $N^{th}$ resonant frequencies are all different.

Furthermore, the first through $N^{th}$ feedback conversion circuits each include an $i^{th}$ in-phase digital mixer configured to mix the in-phase digital output signal with an $i^{th}$ in-phase up-shifting clock, having an $i^{th}$ in-phase up-shifting frequency, to generate an $i^{th}$ in-phase digital feedback signal; an $i^{th}$ in-phase digital-to-analog converter configured to convert the $i^{th}$ in-phase digital feedback signal to the $i^{th}$ in-phase analog feedback circuit; an $i^{th}$ quadrature digital mixer configured to mix the quadrature digital output signal with an $i^{th}$ quadrature up-shifting clock, having an $i^{th}$ quadrature up-shifting frequency, to generate an $i^{th}$ quadrature digital feedback signal; and an $i^{th}$ quadrature digital-to-analog converter configured to convert the $i^{th}$ quadrature digital feedback signal to the $i^{th}$ quadrature analog feedback circuit, wherein is an index value that varies from 1 to N, wherein the first through $N^{th}$ in-phase up-shifting frequencies are all different, and wherein the first through $N^{th}$ quadrature up-shifting frequencies are ninety degrees out of phase with the first through $N^{th}$ in-phase up-shifting frequencies.

Furthermore, the output conversion circuit further comprises an in-phase output analog-to-digital converter, operating in response to an in-phase clock, configured to receive the first corrected output signal and to generate the in-phase digital output signal; and a quadrature output analog-to-digital converter, operating in response to a quadrature clock, configured to receive the first corrected output signal and to generate the quadrature digital output signal.

As an alternative, the output conversion circuit further comprises an in-phase mixer configured to mix the corrected output signal with the in-phase clock to generate a corrected in-phase output signal; a quadrature mixer configured to mix the corrected output signal with the quadrature clock to generate a corrected quadrature output signal; first through $M^{th}$ in-phase output digital-to-analog converters configured to convert the in-phase digital output signal to first through $M^{th}$ in-phase analog output signals; first through $M^{th}$ in-phase output summing junctions configured to subtract the first through $M^{th}$ in-phase analog output signals from first through $M^{th}$ in-phase intermediate signals to generate first through $M^{th}$ in-phase filter input signals; first through $M^{th}$ in-phase low pass filters configured to filter first through $M^{th}$ in-phase filter input signals, respectfully, to generate first through $M^{th}$ in-phase filter output signals; first through $M^{th}$ quadrature output digital-to-analog converters configured to convert the quadrature digital output signal to first through $M^{th}$ quadrature analog output signals; first through $M^{th}$ quadrature output summing junctions configured to subtract the first through $M^{th}$ quadrature analog output signals from first through $M^{th}$ quadrature intermediate signals to generate first through $M^{th}$ quadrature filter input signals; first through $M^{th}$ quadrature low pass filters configured to filter first through $M^{th}$ quadrature filter input signals, respectfully, to generate first through $M^{th}$ quadrature filter output signals; an in-phase analog-to-digital converter, operating in response to the in-phase clock, configured to receive the in-phase filter output signal and to generate the in-phase digital output signal; and a quadrature output analog-to-digital converter, operating in response to the quadrature clock, configured to receive the quadrature filter output signal and to generate the quadrature digital output signal, wherein the corrected in-phase output signal is the $M^{th}$ in-phase intermediate signal and the corrected quadrature output signal is the $M^{th}$ quadrature intermediate signal, wherein M is an integer greater than 1, wherein the $i^{th}$ in-phase intermediate signal is equal to the $(i+1)^{th}$ in-phase filter output, wherein the $i^{th}$ quadrature intermediate signal is equal to the $(i+1)^{th}$ quadrature filter output, and wherein i is an index that varies from 1 to $(M-1)$.

The invention also features an improved bandpass delta-sigma converter which includes a circuit for demodulating a radio-frequency signal and providing an in-phase digital output signal and a quadrature digital output signal, comprising first through $N^{th}$ filter stages configured to receive first through $N^{th}$ input signals, first through $N^{th}$ anterior in-phase analog feedback signals, first through $N^{th}$ posterior in-phase analog feedback signals, first through $N^{th}$ anterior quadrature analog feedback signals and first through $N^{th}$ posterior quadrature analog feedback signals, respectively, and to generate first through $N^{th}$ corrected output signals; first through $N^{th}$ in-phase feedback conversion circuits configured to receive the in-phase digital output signal and to generate the first through $N^{th}$ anterior in-phase analog feedback signals and the first through $N^{th}$ posterior in-phase analog feedback signals, respectively; first through $N^{th}$ quadrature feedback conversion circuits configured to receive the quadrature digital output signal, and to generate the first through $N^{th}$ anterior quadrature analog feedback signals and the first through $N^{th}$ posterior quadrature analog feedback signals, respectively; an in-phase output analog-to-digital converter, operating in response to an in-phase clock, configured to receive the first corrected output signal and to generate the in-phase digital output signal; and a quadrature output analog-to-digital converter, operating in response to a quadrature clock, configured to receive the first corrected output signal and to generate the quadrature digital output signal, wherein N is an integer greater than 1, wherein each of the first through $N^{th}$ filter stages includes an anterior resonator, a posterior resonator, an anterior summing junction, and a posterior summing junction, wherein each of the first through $(N-1)^{th}$ filter stages includes an analog mixer and a frequency-shifting clock, wherein the resonators in each filter stage have the same resonant frequency, wherein the resonant frequencies used in each of the first through $N^{th}$ filter stages are different, wherein the $N^{th}$ input signal is the radio-frequency signal, wherein the first through $(N-1)^{th}$ input signals are the second through $N^{th}$ corrected output signals, respectively, and wherein the quadrature clock is ninety degrees out of phase with the in-phase clock.

The $N^{th}$ filter stage includes an $N^{th}$ anterior summing junction configured to subtract the $N^{th}$ anterior in-phase analog feedback signal and the $N^{th}$ anterior quadrature analog feedback signal from the radio-frequency signal to generate an $N^{th}$ anterior input signal; an $N^{th}$ anterior resonator, having an $N^{th}$ resonant frequency, configured to receive the $N^{th}$ anterior corrected input signal and to generate the $N^{th}$ anterior corrected output signal; an $N^{th}$ posterior summing junction configured to subtract the $N^{th}$ posterior in-phase analog feedback signal and the $N^{th}$ posterior quadrature analog feedback signal from the $N^{th}$ anterior corrected output signal to generate an $N^{th}$ posterior input signal; an $N^{th}$ posterior resonator, having the $N^{th}$ resonant frequency, configured to receive the $N^{th}$ posterior corrected input signal and to generate the $N^{th}$ corrected output signal.

The first through $(N-1)^{th}$ filter stages each include an $i^{th}$ frequency-shifting clock configured to generate an $i^{th}$ frequency-shifting clock signal; an $i^{th}$ analog mixer configured to mix the $(i+1)^{th}$ corrected output signal and the $i^{th}$ frequency-shifting clock signal to generate an $i^{th}$ intermediate signal; an $i^{th}$ anterior summing junction configured to subtract the $i^{th}$ anterior in-phase analog feedback signal and the $i^{th}$ anterior quadrature analog feedback signal from the $i^{th}$ intermediate signal to generate the $i^{th}$ anterior corrected input signal; an $i^{th}$ anterior resonator, having an $i^{th}$ resonant frequency, configured to receive the $i^{th}$ anterior corrected input signal and to generate the $i^{th}$ anterior corrected output signal; an $i^{th}$ posterior summing junction configured to subtract the $i^{th}$ posterior in-phase analog feedback signal and the $i^{th}$ posterior quadrature analog feedback signal from the $i^{th}$ anterior corrected output signal to generate the $i^{th}$ posterior corrected input signal; and an $i^{th}$ resonator, having the $i^{th}$ resonant frequency, configured to receive the $i^{th}$ posterior corrected input signal and to generate the $i^{th}$ corrected output signal, wherein i is an index value that varies from 1 to $(N-1)$, and wherein the first through $N^{th}$ resonant frequencies are all different.

The invention also features a method for demodulating and digitizing a radio frequency signal, comprising receiving the radio frequency signal at an input frequency; generating first through $N^{th}$ analog feedback signals from a digital output signal, the first through $N^{th}$ analog feedback signals having first through $N^{th}$ feedback frequencies, respectively; generating first through $(N-1)^{th}$ frequency-shifting clock signals, each of the first through $(N-1)^{th}$ frequency-shifting clock signals having a first through $(N-1)^{th}$ shifting frequency, respectively; subtracting the $N^{th}$ analog feedback signal from the radio-frequency signal to generate an $N^{th}$ intermediate signal; filtering the $N^{th}$ intermediate signal in an $N^{th}$ resonator, having an $N^{th}$ resonance frequency, to generate an $N^{th}$ analog output signal; repeating for values of i descending from $(N-1)$ to 1, generating an $i^{th}$ intermediate signal based on the $(i+1)^{th}$ analog output signal, the $i^{th}$ analog feedback signal, and the $i^{th}$ frequency-shifting clock signal, the $i^{th}$ intermediate signal having an $i^{th}$ intermediate frequency; and filtering the $i^{th}$ intermediate signal in an $i^{th}$ resonator, having an $i^{th}$ resonance frequency, to generate an $i^{th}$ analog output signal; and converting the first analog output signal into the digital output signal, wherein N is an integer greater than 1, wherein i is an index integer that varies between 1 and $(N-1)$, wherein each of the first through $N^{th}$ resonance frequencies are different, and wherein for each value of i, the $i^{th}$ intermediate frequency is the same as the $i^{th}$ resonance frequency.

The generating of the $i^{th}$ intermediate signal further comprises mixing the $i^{th}$ frequency-shifting clock signal with the $(i+1)^{th}$ analog output signal to generate an $i^{th}$ frequency-shifted signal; and subtracting the $i^{th}$ analog feedback signal from the $i^{th}$ frequency shifted signal to generate the $i^{th}$ intermediate signal.

Also, the generating of the first through $N^{th}$ analog feedback signals further comprises generating first through $N^{th}$ feedback clocks, the first through $N^{th}$ feedback clocks having first through $N^{th}$ feedback frequencies, respectively; mixing the digital output signal with the first through $N^{th}$ feedback clocks, respectively, to generate first through $N^{th}$ digital feedback signals; and converting the first through $N^{th}$ digital feedback signals into the first through $N^{th}$ analog feedback signals, respectively, wherein a $j^{th}$ feedback frequency is equal to the $j^{th}$ resonance frequency, and wherein j is an index integer that varies from 1 to N.

Furthermore, the generating of the $i^{th}$ intermediate signal further comprises subtracting the $i^{th}$ analog feedback signal from the $(i+1)^{th}$ output signal to generate an $i^{th}$ error-corrected signal; and mixing the $i^{th}$ frequency-shifting clock signal with the $i^{th}$ error-corrected signal to generate the $i^{th}$ intermediate signal.

Furthermore, the generating of the first through $N^{th}$ analog feedback signals further comprises generating first through $N^{th}$ feedback clocks, the first through $N^{th}$ feedback clocks having first through $N^{th}$ feedback frequencies, respectively; mixing the digital output signal with the first through $N^{th}$ feedback clocks, respectively, to generate first through $N^{th}$ digital feedback signals; and converting the first through $N^{th}$ digital feedback signals into the first through $N^{th}$ analog feedback signals, respectively, wherein the $N^{th}$ feedback frequency is equal to the $N^{th}$ resonance frequency, and wherein an $i^{th}$ feedback frequency is equal to the $(i+1)^{th}$ resonance frequency.

The invention also features a method for demodulating and digitizing a radio frequency signal, comprising receiving the radio frequency signal at an input frequency; generating first through $N^{th}$ in-phase analog feedback signals from an in-phase digital output signal, the first through $N^{th}$ in-phase analog feedback signals having first through $N^{th}$ in-phase feedback frequencies, respectively; generating first through $N^{th}$ quadrature analog feedback signals from a quadrature digital output signal, the first through $N^{th}$ quadrature analog feedback signals having first through $N^{th}$ quadrature feedback frequencies, respectively; generating first through $(N-1)^{th}$ frequency-shifting clock signals, each of the first through $(N-1)^{th}$ frequency-shifting clock signals having a first through $(N-1)^{th}$ shifting frequency, respectively; subtracting the $N^{th}$ in-phase analog feedback signal and the $N^{th}$ quadrature analog feedback signal from the radio-frequency signal to generate an $N^{th}$ intermediate signal; filtering the $N^{th}$ intermediate signal in an $N^{th}$ resonator, having an $N^{th}$ resonance frequency, to generate an $N^{th}$ analog output signal; repeating for values of i descending from $(N-1)$ to 1; generating an $i^{th}$ intermediate signal based on the $(i+1)^{th}$ analog output signal, the $i^{th}$ in-phase analog feedback signal, the $i^{th}$ quadrature analog feedback signal, and the $i^{th}$ frequency-shifting clock signal, the $i^{th}$ intermediate signal having an $i^{th}$ intermediate frequency; and filtering the $i^{th}$ intermediate signal in an $i^{th}$ resonator, having an $i^{th}$ resonance frequency, to generate an $i^{th}$ analog output signal; converting the first analog output signal at an in-phase output frequency into the in-phase digital output signal; and converting the first analog output signal at a quadrature output frequency into the quadrature digital output signal, the quadrature output frequency being ninety degrees out of phase with the in-phase output frequency, wherein N is an integer greater than 1, wherein i is an index integer that varies between 1 and $(N-1)$, wherein each of the first through $N^{th}$ resonance frequencies are different, and wherein for each value of i, the $i^{th}$ intermediate frequency is the same as the $i^{th}$ resonance frequency.

The generating of the $i^{th}$ intermediate signal further comprises mixing the $i^{th}$ frequency-shifting clock signal with the $(i+1)^{th}$ analog output signal to generate an $i^{th}$ frequency-shifted signal; and subtracting the $i^{th}$ in-phase analog feedback signal and the $i^{th}$ quadrature analog feedback signal from the $i^{th}$ frequency shifted signal to generate the $i^{th}$ intermediate signal.

Furthermore, the generating of the first through $N^{th}$ analog feedback signals further comprises generating first through $N^{th}$ in-phase feedback clocks, the first through $N^{th}$ feedback clocks having first through $N^{th}$ in-phase feedback frequencies, respectively; generating first through $N^{th}$ quadrature feedback clocks, the first through $N^{th}$ feedback clocks having first through $N^{th}$ quadrature feedback frequencies, respectively, the first through $N^{th}$ quadrature feedback frequencies being ninety degrees out of phase with the first through $N^{th}$ in-phase feedback frequencies, respectively; mixing the digital output signal with the first through $N^{th}$ in-phase feedback clocks, respectively, to generate first through $N^{th}$ in-phase digital feedback signals; mixing the digital output signal with the first through $N^{th}$ quadrature feedback clocks, respectively, to generate first through $N^{th}$ quadrature digital feedback signals; converting the first through $N^{th}$ in-phase digital feedback signals into the first through $N^{th}$ in-phase analog feedback signals, respectively; and converting the first through $N^{th}$ quadrature digital feedback signals into the first through $N^{th}$ quadrature analog feedback signals, respectively, wherein a $j^{th}$ in-phase feedback frequency is equal to the $j^{th}$ resonance frequency, and wherein j is an index integer that varies from 1 to N.

Furthermore, the generating of the $i^{th}$ intermediate signal further comprises subtracting the $i^{th}$ in-phase analog feedback signal and the $i^{th}$ quadrature analog feedback signal from the $(i+1)^{th}$ output signal to generate an $i^{th}$ error-corrected signal; and mixing the $i^{th}$ frequency-shifting clock signal with the $i^{th}$ error-corrected signal to generate the $i^{th}$ intermediate signal.

Also, the generating of the first through $N^{th}$ analog feedback signals further comprises generating first through $N^{th}$ in-phase feedback clocks, the first through $N^{th}$ feedback clocks having first through $N^{th}$ in-phase feedback frequencies, respectively; generating first through $N^{th}$ quadrature feedback clocks, the first through $N^{th}$ feedback clocks having first through $N^{th}$ quadrature feedback frequencies, respectively, the first through $N^{th}$ quadrature feedback frequencies being ninety degrees out of phase with the first through $N^{th}$ in-phase feedback frequencies, respectively; mixing the digital output signal with the first through $N^{th}$ in-phase feedback clocks, respectively, to generate first through $N^{th}$ in-phase digital feedback signals; mixing the digital output signal with the first through $N^{th}$ quadrature feedback clocks, respectively, to generate first through $N^{th}$ quadrature digital feedback signals; converting the first through $N^{th}$ in-phase digital feedback signals into the first through $N^{th}$ in-phase analog feedback signals, respectively; and converting the first through $N^{th}$ quadrature digital feedback signals into the first through $N^{th}$ quadrature analog feedback signals, respectively, wherein the $N^{th}$ in-phase feedback frequency is equal to the $N^{th}$ resonance frequency, and wherein an $i^{th}$ in-phase feedback frequency is equal to the $(i+1)^{th}$ resonance frequency.

The invention also features a method for demodulating and digitizing a radio frequency signal, comprising receiving the radio frequency signal at an input frequency; generating first through $N^{th}$ anterior in-phase analog feedback signals and first through $N^{th}$ posterior in-phase analog feedback signals from an in-phase digital output signal, the first through $N^{th}$ anterior in-phase analog feedback signals and the first through $N^{th}$ posterior in-phase analog feedback signals having first through $N^{th}$ in-phase feedback frequencies, respectively; generating first through $N^{th}$ anterior quadrature analog feedback signals and first through $N^{th}$ posterior quadrature analog feedback signals from a quadrature digital output signal, the first through $N^{th}$ anterior quadrature analog feedback signals and the first through $N^{th}$ posterior quadrature analog feedback signals having first through $N^{th}$ quadrature feedback frequencies, respectively; generating first through $(N-1)^{th}$ frequency-shifting clock signals, each of the first through $(N-1)^{th}$ frequency-shifting clock signals having a first through $(N-1)^{th}$ shifting frequency, respectively; subtracting the $N^{th}$ anterior in-phase analog feedback signal and the $N^{th}$ anterior quadrature analog feedback signal from the radio-frequency signal to generate an $N^{th}$ anterior intermediate signal; filtering the $N^{th}$ anterior intermediate signal in an $N^{th}$ anterior resonator, having an $N^{th}$ resonance frequency, to generate an $N^{th}$ anterior analog output signal; subtracting the $N^{th}$ posterior in-phase analog feedback signal and the $N^{th}$ posterior quadrature analog feedback signal from the $N^{th}$ anterior analog signal to generate an $N^{th}$ posterior intermediate signal; filtering the $N^{th}$ posterior intermediate signal in an $N^{th}$ posterior resonator, having the $N^{th}$ resonance frequency, to generate an $N^{th}$ posterior analog output signal; repeating for values of i descending from $(N-1)$ to 1; mixing the $(i+1)^{th}$ posterior analog output signal with the $i^{th}$ frequency-shifting clock signal to generate an $i^{th}$ frequency-shifted signal; subtracting the $i^{th}$ anterior in-phase analog feedback signal and the $i^{th}$ anterior quadrature analog feedback signal from the $(i+1)^{th}$ posterior analog output signal to generate an $i^{th}$ anterior intermediate signal, the $i^{th}$ intermediate signal having an $i^{th}$ intermediate frequency; and filtering the $i^{th}$ anterior intermediate signal in an $i^{th}$ anterior resonator, having an $i^{th}$ resonance frequency, to generate an $i^{th}$ anterior analog output signal; subtracting the $i^{th}$ posterior in-phase analog feedback signal and the $i^{th}$ posterior quadrature analog feedback signal from the $i^{th}$ anterior analog output signal to generate an $i^{th}$ posterior intermediate signal, the $i^{th}$ posterior intermediate signal having the $i^{th}$ intermediate frequency; and filtering the $i^{th}$ posterior intermediate signal in an $i^{th}$ posterior resonator, having the $i^{th}$ resonance frequency, to generate an $i^{th}$ posterior analog output signal; converting the first posterior analog output signal at an in-phase output frequency into the in-phase digital output signal; and converting the first posterior analog output signal at a quadrature output frequency into the quadrature digital output signal, the quadrature output frequency being ninety degrees out of phase with the in-phase output frequency, wherein N is an integer greater than 1, wherein i is an index integer that varies between 1 and (N−1), wherein each of the first through $N^{th}$ resonance frequencies are different, and wherein for each value of i, the $i^{th}$ intermediate frequency is the same as the $i^{th}$ resonance frequency.

Furthermore, the aforementioned method comprises generating M in-phase feedback signals from a digital in-phase output signal; generating M quadrature feedback signals from a digital quadrature output signal; generating a down-converted in-phase signal by multiplying the digital output signal with an in-phase clock; generating a down-converted quadrature signal by multiplying the digital output signal with a quadrature clock, the quadrature clock being ninety degrees out of phase with the in-phase clock; generating an $M^{th}$ in-phase error signal responsive to a difference between the in-phase down-converted signal and the $M^{th}$ in-phase feedback signal; generating an $M^{th}$ quadrature error signal responsive to a difference between the quadrature down-converted signal and the $M^{th}$ quadrature feedback signal; amplifying and low pass filtering the $M^{th}$ in-phase error signal at an $M^{th}$ in-phase low pass filter to generate an $M^{th}$ in-phase filtered signal; amplifying and low pass filtering the $M^{th}$ quadrature error signal at an $M^{th}$ quadrature low pass filter to generate an $M^{th}$ quadrature filtered signal; repeating for values of i descending from (M−1) to 1; generating an $i^{th}$ in-phase error signal responsive to the difference between the $(i+1)^{th}$ in-phase filtered signal and the $i^{th}$ in-phase feedback signal; generating an $i^{th}$ quadrature error signal responsive to the difference between the $(i+1)^{th}$ quadrature filtered signal and the $i^{th}$ quadrature feedback signal; amplifying and low pass filtering the $i^{th}$ in-phase error signal at an $i^{th}$ in-phase low pass filter to generate an $i^{th}$ in-phase filtered signal; amplifying and low pass filtering the $i^{th}$ quadrature error signal at an $i^{th}$ quadrature low pass filter to generate an $i^{th}$ quadrature filtered signal; producing the digital in-phase output signal by over-sampling and digitizing the first in-phase filtered signal using the in-phase clock; and producing the digital quadrature output signal by over-sampling and digitizing the first quadrature filtered signal using the in-phase clock, wherein M is an integer greater than 1, and wherein i is an index integer that varies between 1 and (M−1).

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

Figure 1:
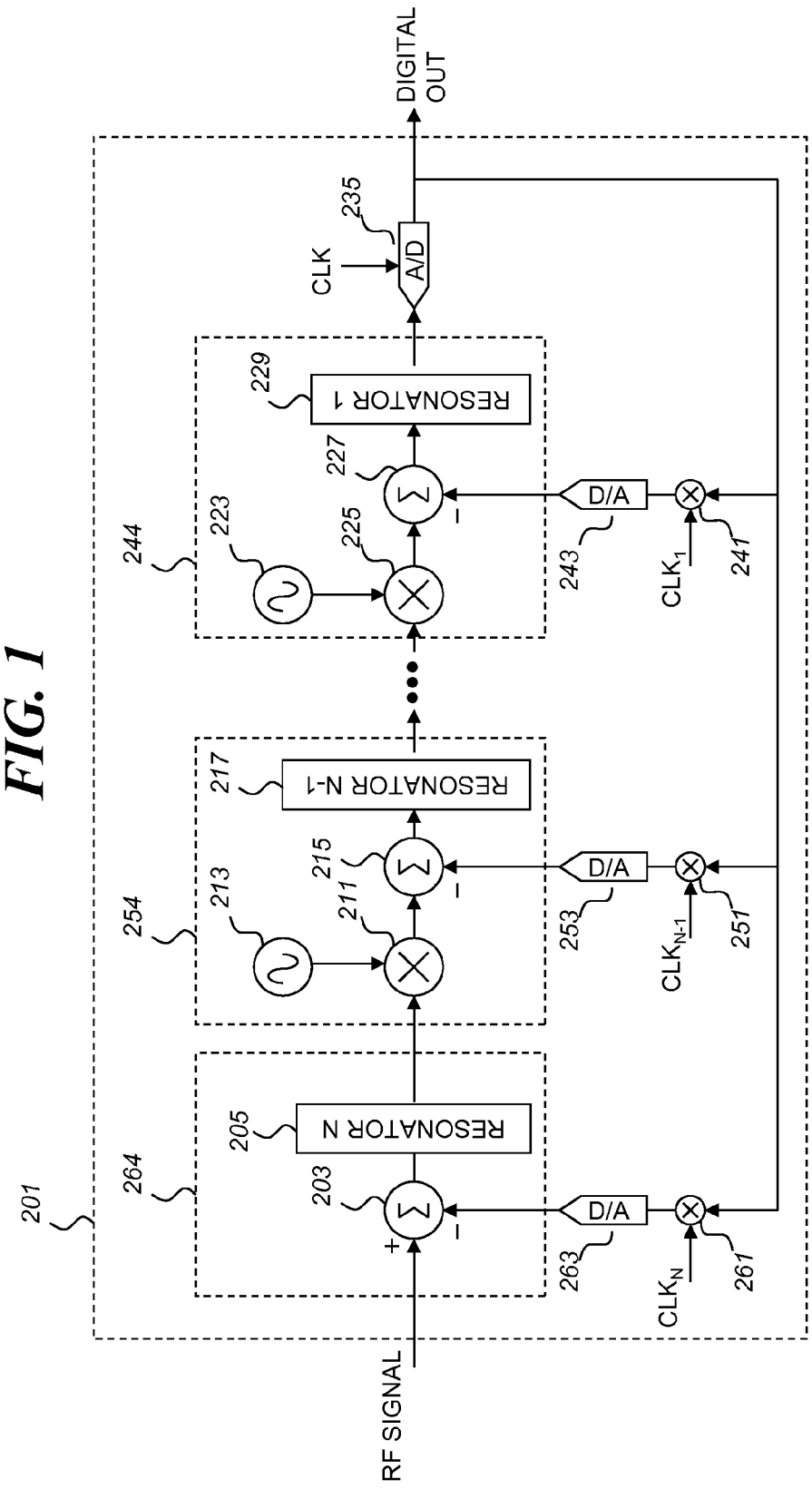
FIG. 1 is a schematic diagram illustrating an exemplary analog-to-digital demodulator in accordance with various embodiments.

In overview, the present disclosure concerns electronic devices or units, some of which are referred to as communication units, such as cellular phone or two-way radios and the like, typically having a capability for rapidly handling data, such as can be associated with a communication system such as an Enterprise Network, a cellular Radio Access Network, or the like. More particularly, various inventive concepts and principles are embodied in circuits, and methods therein for receiving signals in connection with a communication unit.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with in integrated circuits (ICs), such as a digital signal processor or application specific ICs. It is expected that one of ordinary skill, notwithstanding possibly significant effort and many design choices motivated by, for example, available time, current technology, and economic considerations, when guided by the concepts and principles disclosed herein will be readily capable of generating ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

As further discussed herein below, various inventive principles and combinations thereof are advantageously employed to simplify and minimize the analog components in a communication receiver; and yet provide unprecedented performance by demodulating and digitizing the RF signal at the radio frequency directly to baseband or a low digital IF.

Further in accordance with exemplary embodiments, an analog-to-digital demodulator is provided that employs a bandpass sampling technique with feedback, which will be referred to as BS-ADD in later embodiments. One or more embodiments provide for the usage of the bandpass sampling technique to lower the sampling clock frequency of the ADC, which can reduce the power consumption. Furthermore, a novel feedback technique is employed according to various embodiments to increase the conversion resolution of the BS-ADD.

Referring now to FIG. 1, a schematic diagram illustrating an exemplary bandpass-sampling delta-sigma technique in accordance with one or more embodiments will be discussed and described. In overview, the novel feedback technique in conjunction with bandpass-sampling is employed. The illustrated embodiment in FIG. 1 is referred to as a 'bandpass-sampling delta-sigma analog-to-digital demodulator' or BS-ADD 201, which includes a plurality of summing junctions 203, 215, 227, an plurality of resonators connected in cascade 205, 217, 229, a plurality of mixers 211 and 225, a plurality of clock generators 213 and 223, an analog-to-digital converter (A/D), a plurality of digital mixers 241, 251, and 261, and a plurality of digital-to-analog converters (D/A) 243, 253, and 263.

Improvements are sought to minimize the analog pre-processing by demodulating and digitizing the received signal directly at the RF frequency. It is therefore desirable to reduce the sampling clock rate of the A/D 235, if possible, to the RF signal frequency. Using this 'bandpass-sampling' technique, The A/D 235 not only digitizes the RF signal, but by virtue of the bandpass sampling theory, also demodulates the RF signal to baseband.

Bandpass-sampling of the RF signal leads to the inclusion of mixers in the feedback path as well as in the resonator stages. In general, the resonators 205, 217, and 229 are required to have high gains and high Q-factors with resonant frequencies near the input RF signal frequency in typical bandpass delta-sigma A/Ds. At RF frequencies, these resonators are typically constructed using LC resonators, SAW resonators, BAW resonators, or the like. The high gain and high Q-factor often result in an effect known as "resonance pulling and pushing", in which these resonant frequencies are very close to each other. The pulling and pushing effect can be seen as additional undesirable coupling paths between the resonators causing the bandpass delta-sigma A/D to become unstable and inoperable. The analog mixers 211, 225 and clock generators 213, 223 operate to frequency shift the amplified error signal from the previous resonator stage to another frequency location. As the resonant frequency in each resonator has to match with the frequency of the summing junction output, the frequency shifting of error signals after each resonator output can eliminate the resonance pulling/pushing effect as the resonant frequencies of resonators 205, 217, and 229 can be set far apart.

Because the modulated input signal at the RF carrier is frequency-shifted at the various resonator stages and is finally demodulated to baseband by the A/D 235, and by virtue of the bandpass sampling theory, the sampling frequency of the A/D 235 is the same as the resonant frequency of resonator 1 229. Therefore, it is fundamentally necessary to up-convert the demodulated signal at the A/D 235 output in frequency as feedback signals to fulfill the feedback requirement—i.e. the feedback signals must be modulated by the same frequency that carries the signal in the resonator stages so that the correct error signal can be generated at the summing junctions 203, 215 and 227. This requirement dictates the inclusion of the feedback mixers 241, 251 and 261 with separate clocks $CLK_N$, $CLK_{N-1}$, . . . , $CLK_1$ to up-convert the output of the A/D 235 to the proper frequencies allocated to the resonators. The addition of the analog mixers 211, 225 in the resonator stages and digital mixers 241, 251, and 261 in the feedback path set apart a novel BS-ADD 201 that allows bandpass-sampling at the RF frequency, which is fundamentally different from the conventional delta-sigma A/D.

Figure 2:
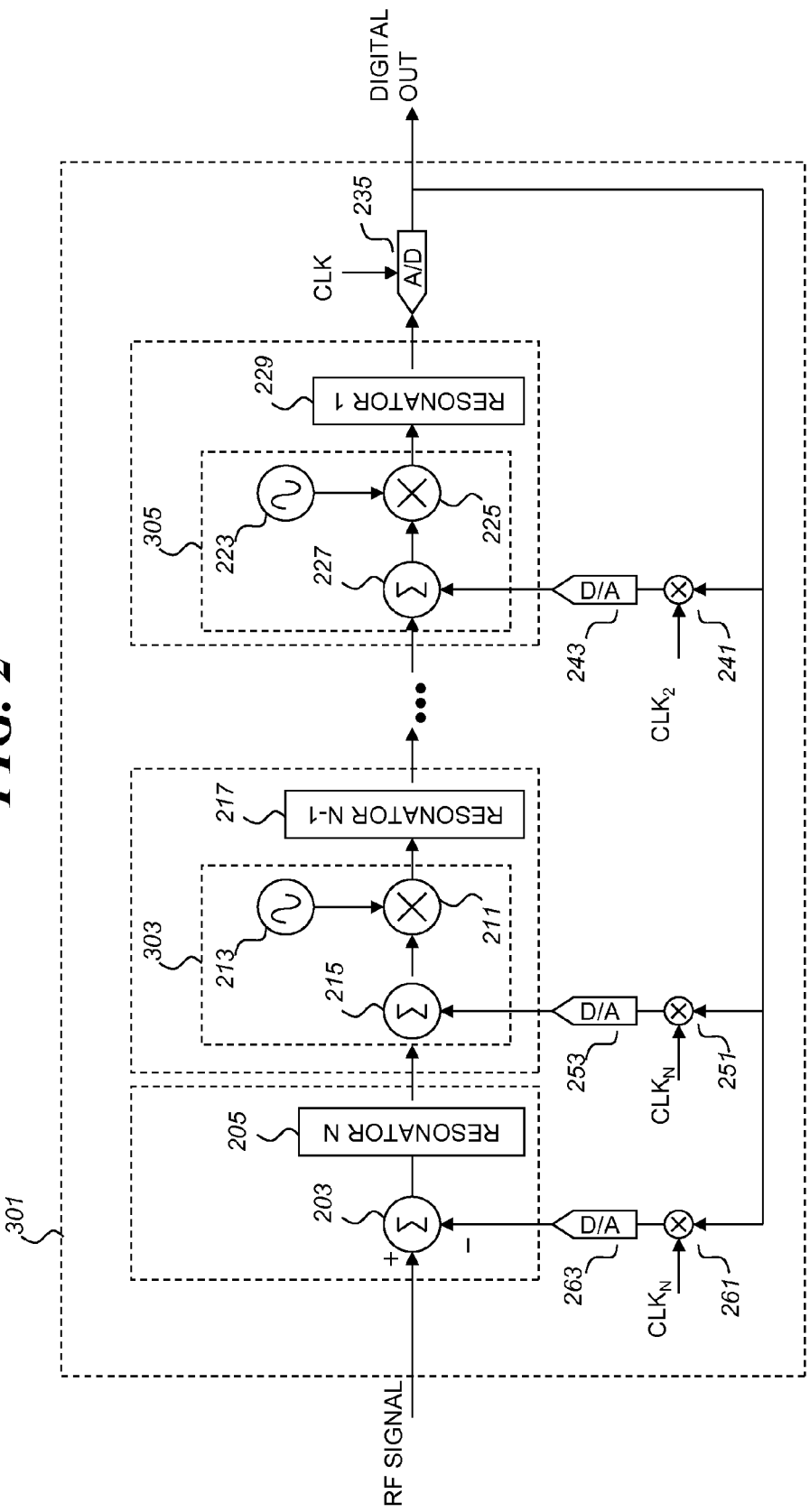
FIG. 2 is a schematic diagram illustrating an alternative exemplary analog-to-digital demodulator in accordance with one or more embodiments.

Referring now to FIG. 2, a schematic diagram illustrating an alternative exemplary BS-ADD in accordance with one or more embodiments will be discussed and described. The BS-ADD 301 has similar characteristics as the BS-ADD 201 in FIG. 1. The main difference is sequencing the analog mixers 211 and 225 with respect to their corresponding summing junctions 215 and 227. In particular, in the embodiments of FIG. 2, the mixers 211, 225 are located after the summing junctions 215, 227 between adjacent resonators 205, 217, 229, rather than before the summing junctions 215, 227, as is the case in the embodiments of FIG. 1.

The feedback signals from D/As 243 and 253 are thus subtracted from the amplified error signals output by the resonators 217 and 205, respectively, before the results are frequency shifted by the mixers 225 and 211, respectively. In this arrangement, the reference clocks to the digital mixers 241 and 251 are different from the ones in FIG. 1 because summing happens before frequency shifting. As a result, the feedback signal must be up-converted to the frequency that matches with the resonator frequency that generates the corresponding error signal to the summing junction that receives the feedback signal.

Figure 3:
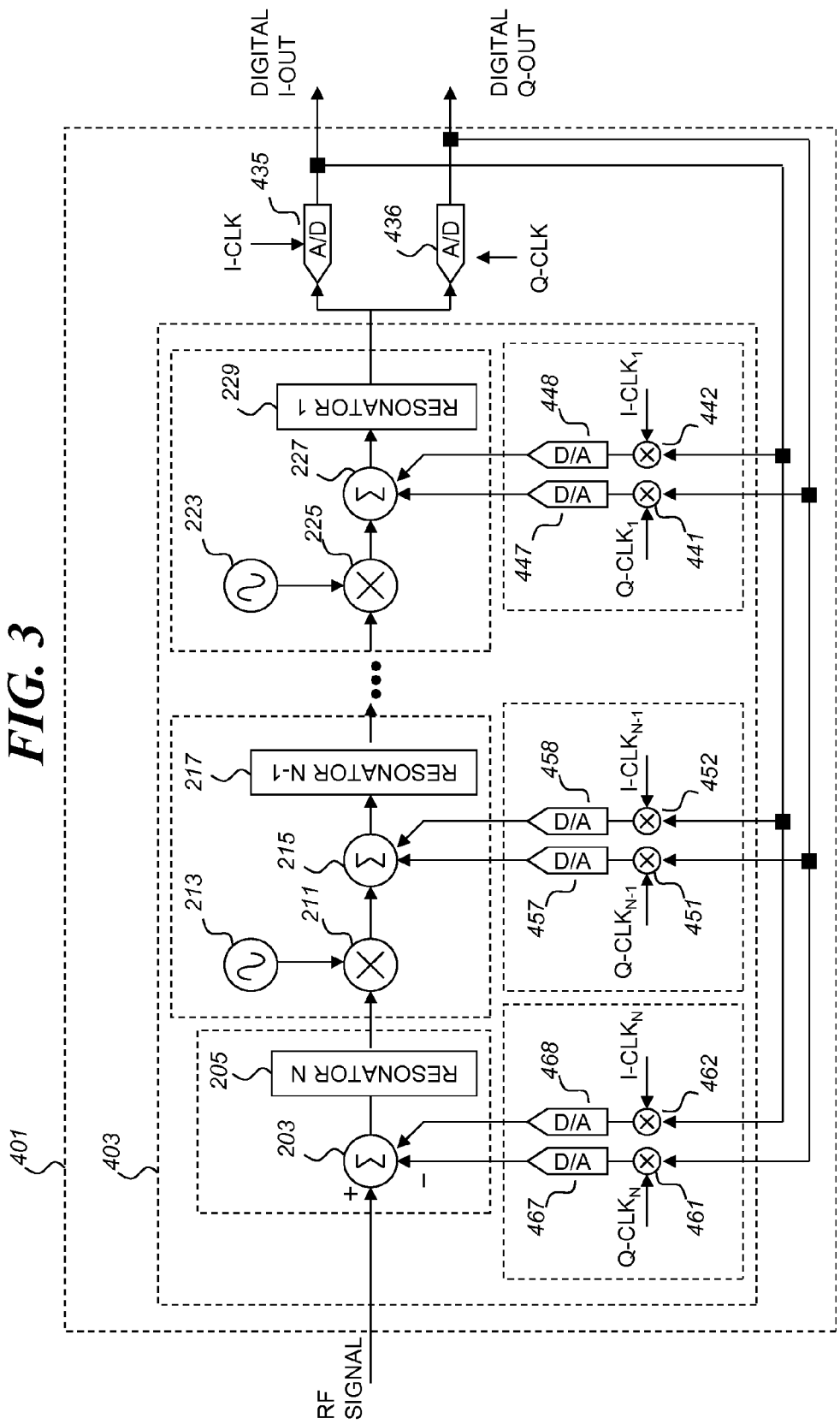
FIG. 3 is a schematic diagram illustrating an alternative exemplary analog-to-digital demodulator in accordance with one or more embodiments.

FIG. 3 provides another alternative exemplary embodiment. As compared to the BS-ADD 201, the output of the resonator 1 229 is sampled by a pair of A/Ds 435 and 436, which operates in quadrature fashion; i.e. the sampling clock I-CLK provided to the A/D 435 is shifted ninety degrees out of phase with respect to the Q-CLK provided to the A/D 436. A similar set of feedback components including the D/As 447, 448, 457, 458, 467, and 468, and digital mixers 441, 442, 451, 452, 461, and 462, are added to provide feedback from the A/Ds 435 and 436. The topology in this embodiment is referred to as quadrature-bandpass-sampling delta-sigma analog-to-digital demodulator (QBS-ADD 401). The in-phase and quadrature images of the RF signal are demodulated to DIGITAL I-OUT and DIGITAL Q-OUT by the A/Ds 435 and 436 respectively.

As shown in FIG. 3, the DIGITAL I-OUT signals are provided as feedback signals to digital mixers 442, 452, and 462, where they are mixed with a corresponding $I-CLK_N$, $I-CLK_{N-1}$, . . . , $I-CLK_1$ to properly up-convert the output of DIGITAL I-OUT signal to the proper frequency allocated to the associated resonator 205, 217, 229. Similarly, the DIGITAL Q-OUT signals are provided as feedback signals to digital mixers 441, 451, and 461, where they are mixed with a corresponding $Q-CLK_N$, $Q-CLK_{N-1}$, $Q-CLK_1$ to properly up-convert the output of DIGITAL Q-OUT signal to the proper frequency allocated to the associated resonator 205, 217, 229. These up-converted signals are then converted from digital signals to analog signals by the D/As 447, 448, 457, 458, 467, and 468, and then outputs of pairs of D/As are provided to the summing junctions 203, 215 and 227.

Figure 4:
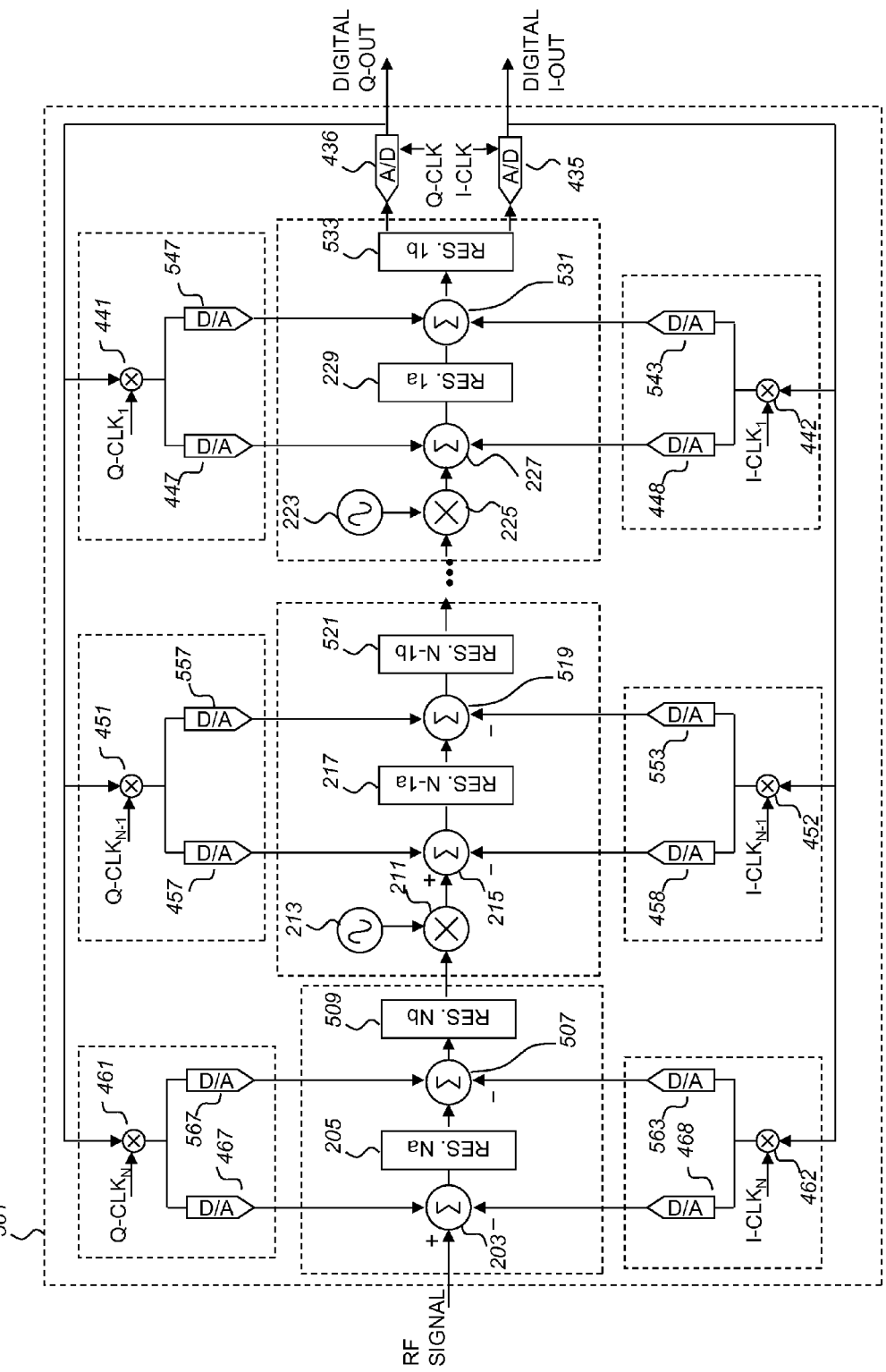
FIG. 4 is a schematic diagram illustrating an alternative exemplary analog-to-digital demodulator in accordance with one or more embodiments.

FIG. 4 provides another alternative exemplary embodiment. The QBS-ADD 501 has the same functionality as the QBS-ADD 401, except that frequency shifting is done after every two resonators. As a result, an additional D/A 543, 553, 563, 547, 557, or 567 is provided at the output of each mixer 441, 442, 451, 452, 461, and 462. The outputs of these D/As 543, 553, 563, 547, 557, or 567 is provided to summing junctions 507, 519, and 531 located between alternating pairs of resonators.

This means that resonator Na 205 and resonator Nb 509 have the same resonant frequency as the RF signal frequency, while resonator N−1a 217 and resonator N−1b 521 co-locate in a different frequency region, and resonators 1a 229, 1b 533 share another different frequency location, etc. Experimental data have shown that resonance pulling/pushing is less severe in group of two resonances. Therefore, the QBS-ADD 501 can still be operable without feedback stability issue. Because of co-location in frequency for each pair of resonators, the feedback D/As 467 and 567 must be up-converted beforehand by the same clock, Q-CLK$_N$ in this case. The same applies to the D/A pairs (263, 563), (457, 557), (253, 553), (447, 547), and (243, 543). This reduces the number of different clocks that need to be provided, which can simplify the resulting circuitry.

Figure 5:
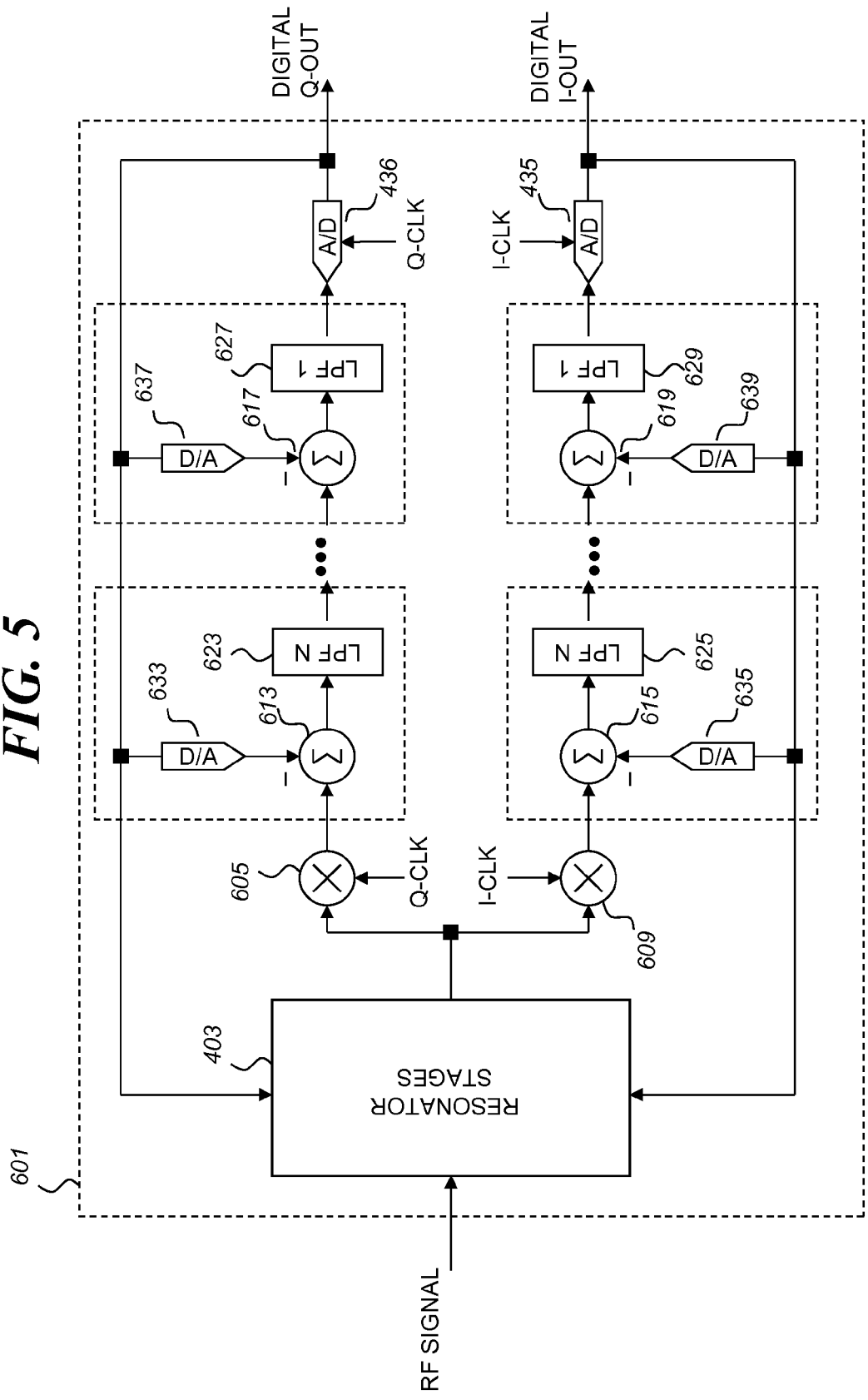
FIG. 5 a schematic diagram illustrating an alternative exemplary analog-to-digital demodulator in accordance with one or more embodiments.

FIG. 5 illustrates the schematic diagram of an alternative exemplary embodiment, which is referred to as a hybrid bandpass-lowpass delta-sigma analog-to-digital demodulator (HBL-ADD 601). In this embodiment, the resonator stages 403 of FIG. 3 are followed by a pair of quadrature mixers 605 and 609 to down-convert the error signal to baseband into a quadrature path and in-phase path, respectively. The mixers 609 and 605 are responsive to the in-phase clock, I-CLK, and quadrature clock, Q-CLK, which are separated by ninety degrees. Sequences of low-pass filters 625, 629 and summing junctions 615, 619 in the in-phase path and low-pass filters 623, 627 and summing junction 613, 617 in the quadrature path are provided to further amplify the error signals before they are sampled by the A/Ds 435, 436. Since all error signals that occur after the demodulating mixers 605 and 609 are down converted to baseband, there is no need to up-convert the feedback signals in the D/As 633, 635, 637, and 639. Thus, the up-converting feedback mixers are omitted.

The term communication unit may be used to denote a wired device, for example a high speed modem, an xDSL type modem, a fiber optic transmission device, and the like, and a wireless device, and typically a wireless device that may be used with a public network, for example in accordance with a service agreement, or within a private network such as an enterprise network or an ad hoc network. Examples of such communication devices include a cellular handset or device, television apparatus, personal digital assistants, personal assignment pads, and personal computers equipped for wireless operation, and the like, or equivalents thereof, provided such devices are arranged and constructed for operation in connection with wired or wireless communication.

The communication units of particular interest are those providing or facilitating voice communications services or data or messaging services normally referred to as ultra wideband networks, cellular wide area networks (WANs), such as conventional two way systems and devices, various cellular phone systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks, LTE (Long Term Evolution) networks, and variants or evolutions thereof.

Furthermore, the wireless communication devices of interest may have short range wireless communications capability normally referred to as WLAN (wireless local area network) capabilities, such as IEEE 802.11, Bluetooth, WPAN (wireless personal area network) or Hyper-Lan and the like using, for example, CDMA, frequency hopping, OFDM (orthogonal frequency division multiplexing) or TDMA (Time Division Multiple Access) access technologies and one or more of various networking protocols, such as TCP/IP (Transmission Control Protocol/Internet Protocol), UDP/UP (Universal Datagram Protocol/Universal Protocol), IPX/SPX (Inter-Packet Exchange/Sequential Packet Exchange), Net BIOS (Network Basic Input Output System) or other protocol structures. Alternatively the wireless communication devices of interest may be connected to a LAN using protocols such as TCP/IP, UDP/UP, IPX/SPX, or Net BIOS via a hardwired interface such as a cable and/or a connector.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit for demodulating a radio-frequency signal and providing a digital output signal, comprising:

first through $N^{th}$ filter stages configured to receive first through $N^{th}$ input signals and first through $N^{th}$ analog feedback signals, respectively, and to generate first through $N^{th}$ corrected output signals;

first through $N^{th}$ feedback conversion circuits configured to receive the digital output signal and generate the first through $N^{th}$ analog feedback signals, respectively;

an output analog-to-digital converter configured to receive the first corrected output signal and generate the digital output signal, wherein N is an integer greater than 1, wherein each of the first through $N^{th}$ filter stages includes a resonator and a summing junction, wherein each of the first through $(N-1)^{th}$ filter stages includes an analog mixer and a frequency-shifting clock, wherein the resonators in each of the first through $N^{th}$ filter stages have different resonant frequencies, wherein the $N^{th}$ input signal is the radio-frequency signal, and wherein the first through $(N-1)^{th}$ input signals are the second through $N^{th}$ corrected output signals, respectively.

2. The circuit of claim 1, wherein
the $N^{th}$ filter stage includes
an $N^{th}$ summing junction configured to subtract the $N^{th}$ analog feedback signal from the radio-frequency signal to generate an $N^{th}$ corrected input signal; and
an $N^{th}$ resonator, having an $N^{th}$ resonant frequency, configured to receive the $N^{th}$ corrected input signal and to generate the $N^{th}$ corrected output signal,
wherein the $N^{th}$ resonator has an $N^{th}$ resonant frequency.

3. The circuit of claim 2, wherein
the first through $(N-1)^{th}$ filter stages each include
an $i^{th}$ frequency-shifting clock configured to generate an $i^{th}$ frequency-shifting clock signal;
an $i^{th}$ mixer configured to mix the $(i+1)^{th}$ corrected output signal and the $i^{th}$ frequency-shifting clock signal to generate an $i^{th}$ intermediate signal;

an $i^{th}$ summing junction configured to subtract the $i^{th}$ analog feedback signal from the $i^{th}$ intermediate signal to generate the $i^{th}$ corrected input signal; and an $i^{th}$ resonator, having an $i^{th}$ resonant frequency, configured to receive the $i^{th}$ corrected input signal and to generate the $i^{th}$ corrected output signal, wherein i is an index value that varies from 1 to (N−1), and wherein the first through $N^{th}$ resonant frequencies are all different.

4. The circuit of claim 2, wherein the first through $(N-1)^{th}$ filter stages each include an $i^{th}$ summing junction configured to subtract the $i^{th}$ analog feedback signal from the $(i+1)^{th}$ corrected output signal to generate an $i^{th}$ intermediate signal; and an $i^{th}$ frequency-shifting clock configured to generate an $i^{th}$ frequency-shifting clock signal;

an $i^{th}$ analog mixer configured to mix the $i^{th}$ intermediate signal and the $i^{th}$ frequency-shifting clock signal to generate the $i^{th}$ corrected input signal;

an $i^{th}$ resonator, having an $i^{th}$ resonant frequency, configured to receive the $i^{th}$ corrected input signal and to generate the $i^{th}$ corrected output signal, wherein i is an index value that varies from 1 to (N−1), and wherein the first through $N^{th}$ resonant frequencies are all different.

5. The circuit of claim 1, wherein the first through $N^{th}$ feedback conversion circuits each include an $i^{th}$ digital mixer configured to mix the digital output signal with an $i^{th}$ up-shifting clock, having an $i^{th}$ up-shifting frequency, to generate an $i^{th}$ digital feedback signal; and an $i^{th}$ digital-to-analog converter configured to convert the $i^{th}$ digital feedback signal to the $i^{th}$ analog feedback circuit, wherein i is an index value that varies from 1 to N, and wherein the first through $N^{th}$ up-shifting frequencies are all different.

6. A circuit for demodulating a radio-frequency signal and providing an in-phase digital output signal and a quadrature digital output signal, comprising:

first through $N^{th}$ filter stages configured to receive first through $N^{th}$ input signals, first through $N^{th}$ in-phase analog feedback signals, and first through $N^{th}$ quadrature analog feedback signals, respectively, and to generate first through $N^{th}$ corrected output signals;

first through $N^{th}$ feedback conversion circuits configured to receive the in-phase digital output signal and the quadrature digital output signal, and to generate the first through $N^{th}$ in-phase analog feedback signals and the first through $N^{th}$ quadrature analog feedback signals, respectively; and an output conversion circuit configured to receive the first corrected output signal, an in-phase clock, and a quadrature clock, and to generate the in-phase digital output signal and the quadrature digital output signal, wherein N is an integer greater than 1, wherein each of the first through $N^{th}$ filter stages includes a resonator and a summing junction, wherein each of the first through $(N-1)^{th}$ filter stages includes an analog mixer and a frequency-shifting clock, wherein the resonators in each of the first through $N^{th}$ filter stages have different resonant frequencies, wherein the $N^{th}$ input signal is the radio-frequency signal, wherein the first through $(N-1)^{th}$ input signals are the second through $N^{th}$ corrected output signals, respectively, and wherein the quadrature clock is ninety degrees out of phase with the in-phase clock.

7. The circuit of claim 6, wherein the $N^{th}$ filter stage includes an $N^{th}$ summing junction configured to subtract the $N^{th}$ in-phase analog feedback signal and the $N^{th}$ quadrature analog feedback signal from the radio-frequency signal to generate an $N^{th}$ corrected input signal; and an $N^{th}$ resonator, having an $N^{th}$ resonant frequency, configured to receive the $N^{th}$ corrected input signal and to generate the $N^{th}$ corrected output signal.

8. The circuit of claim 7, wherein the first through $(N-1)^{th}$ filter stages each include an $i^{th}$ frequency-shifting clock configured to generate an $i^{th}$ frequency-shifting clock signal;

an $i^{th}$ mixer configured to mix the $(i+1)^{th}$ corrected output signal and the $i^{th}$ frequency-shifting clock signal to generate an $i^{th}$ intermediate signal;

an $i^{th}$ summing junction configured to subtract the $i^{th}$ in phase analog feedback signal and the $i^{th}$ quadrature analog feedback signal from the $i^{th}$ intermediate signal to generate the $i^{th}$ corrected input signal; and an $i^{th}$ resonator, having an $i^{th}$ resonant frequency, configured to receive the $i^{th}$ corrected input signal and to generate the $i^{th}$ corrected output signal, wherein i is an index value that varies from 1 to (N−1), and wherein the first through $N^{th}$ resonant frequencies are all different.

9. The circuit of claim 7, wherein the first through $(N-1)^{th}$ filter stages each include an $i^{th}$ summing junction configured to subtract the $i^{th}$ in phase analog feedback signal and the $i^{th}$ quadrature analog feedback signal from the $(i+1)^{th}$ corrected output signal to generate an $i^{th}$ intermediate signal; and an $i^{th}$ frequency-shifting clock configured to generate an $i^{th}$ frequency-shifting clock signal;

an $i^{th}$ analog mixer configured to mix the $i^{th}$ intermediate signal and the $i^{th}$ frequency-shifting clock signal to generate the $i^{th}$ corrected input signal;

an $i^{th}$ resonator, having an $i^{th}$ resonant frequency, configured to receive the $i^{th}$ corrected input signal and to generate the $i^{th}$ corrected output signal, wherein i is an index value that varies from 1 to (N−1), and wherein the first through $N^{th}$ resonant frequencies are all different.

10. The circuit of claim 1, wherein the first through $N^{th}$ feedback conversion circuits each include an $i^{th}$ in-phase digital mixer configured to mix the in-phase digital output signal with an $i^{th}$ in-phase up-shifting clock, having an $i^{th}$ in-phase up-shifting frequency, to generate an $i^{th}$ in-phase digital feedback signal;

an $i^{th}$ in-phase digital-to-analog converter configured to convert the $i^{th}$ in-phase digital feedback signal to the $i^{th}$ in-phase analog feedback circuit;

an $i^{th}$ quadrature digital mixer configured to mix the quadrature digital output signal with an $i^{th}$ quadrature up-shifting clock, having an $i^{th}$ quadrature up-shifting frequency, to generate an $i^{th}$ quadrature digital feedback signal; and an $i^{th}$ quadrature digital-to-analog converter configured to convert the $i^{th}$ quadrature digital feedback signal to the $i^{th}$ quadrature analog feedback circuit, wherein i is an index value that varies from 1 to N, wherein the first through $N^{th}$ in-phase up-shifting frequencies are all different, and wherein the first through $N^{th}$ quadrature up-shifting frequencies are ninety degrees out of phase with the first through $N^{th}$ in-phase up-shifting frequencies.

11. The circuit of claim 6, wherein the output conversion circuit further comprises:
- an in-phase output analog-to-digital converter, operating in response to an in-phase clock, configured to receive the first corrected output signal and to generate the in-phase digital output signal; and
- a quadrature output analog-to-digital converter, operating in response to a quadrature clock, configured to receive the first corrected output signal and to generate the quadrature digital output signal.

12. The circuit of claim 6, wherein the output conversion circuit further comprises:
- an in-phase mixer configured to mix the corrected output signal with the in-phase clock to generate a corrected in-phase output signal;
- a quadrature mixer configured to mix the corrected output signal with the quadrature clock to generate a corrected quadrature output signal;
- first through $M^{th}$ in-phase output digital-to-analog converters configured to convert the in-phase digital output signal to first through $M^{th}$ in-phase analog output signals;
- first through $M^{th}$ in-phase output summing junctions configured to subtract the first through $M^{th}$ in-phase analog output signals from first through $M^{th}$ in-phase intermediate signals to generate first through $M^{th}$ in-phase filter input signals;
- first through $M^{th}$ in-phase low pass filters configured to filter first through $M^{th}$ in-phase filter input signals, respectfully, to generate first through $M^{th}$ in-phase filter output signals;
- first through $M^{th}$ quadrature output digital-to-analog converters configured to convert the quadrature digital output signal to first through $M^{th}$ quadrature analog output signals;
- first through $M^{th}$ quadrature output summing junctions configured to subtract the first through $M^{th}$ quadrature analog output signals from first through $M^{th}$ quadrature intermediate signals to generate first through $M^{th}$ quadrature filter input signals;
- first through $M^{th}$ quadrature low pass filters configured to filter first through $M^{th}$ quadrature filter input signals, respectfully, to generate first through $M^{th}$ quadrature filter output signals;
- an in-phase analog-to-digital converter, operating in response to the in-phase clock, configured to receive the in-phase filter output signal and to generate the in-phase digital output signal; and
- a quadrature output analog-to-digital converter, operating in response to the quadrature clock, configured to receive the quadrature filter output signal and to generate the quadrature digital output signal,
- wherein the corrected in-phase output signal is the $M^{th}$ in-phase intermediate signal and the corrected quadrature output signal is the $M^{th}$ quadrature intermediate signal,
- wherein M is an integer greater than 1,
- wherein the $i^{th}$ in-phase intermediate signal is equal to the $(i+1)^{th}$ in-phase filter output,
- wherein the $i^{th}$ quadrature intermediate signal is equal to the $(i+1)^{th}$ quadrature filter output, and
- wherein i is an index that varies from 1 to (M−1).

13. A circuit for demodulating a radio-frequency signal and providing an in-phase digital output signal and a quadrature digital output signal, comprising:
- first through $N^{th}$ filter stages configured to receive first through $N^{th}$ input signals, first through $N^{th}$ anterior in-phase analog feedback signals, first through $N^{th}$ posterior in-phase analog feedback signals, first through $N^{th}$ anterior quadrature analog feedback signals and first through $N^{th}$ posterior quadrature analog feedback signals, respectively, and to generate first through $N^{th}$ corrected output signals;
- first through $N^{th}$ in-phase feedback conversion circuits configured to receive the in-phase digital output signal and to generate the first through $N^{th}$ anterior in-phase analog feedback signals and the first through $N^{th}$ posterior in-phase analog feedback signals, respectively;
- first through $N^{th}$ quadrature feedback conversion circuits configured to receive the quadrature digital output signal, and to generate the first through $N^{th}$ anterior quadrature analog feedback signals and the first through $N^{th}$ posterior quadrature analog feedback signals, respectively;
- an in-phase output analog-to-digital converter, operating in response to an in-phase clock, configured to receive the first corrected output signal and to generate the in-phase digital output signal; and
- a quadrature output analog-to-digital converter, operating in response to a quadrature clock, configured to receive the first corrected output signal and to generate the quadrature digital output signal,
- wherein N is an integer greater than 1,
- wherein each of the first through $N^{th}$ filter stages includes an anterior resonator, a posterior resonator, an anterior summing junction, and a posterior summing junction,
- wherein each of the first through $(N-1)^{th}$ filter stages includes an analog mixer and a frequency-shifting clock,
- wherein the resonators in each filter stage have the same resonant frequency,
- wherein the resonant frequencies used in each of the first through $N^{th}$ filter stages are different,
- wherein the $N^{th}$ input signal is the radio-frequency signal,
- wherein the first through $(N-1)^{th}$ input signals are the second through $N^{th}$ corrected output signals, respectively, and
- wherein the quadrature clock is ninety degrees out of phase with the in-phase clock.

14. The circuit of claim 13, wherein
the $N^{th}$ filter stage includes
- an $N^{th}$ anterior summing junction configured to subtract the $N^{th}$ anterior in-phase analog feedback signal and the $N^{th}$ anterior quadrature analog feedback signal from the radio-frequency signal to generate an $N^{th}$ anterior input signal;
- an $N^{th}$ anterior resonator, having an $N^{th}$ resonant frequency, configured to receive the $N^{th}$ anterior corrected input signal and to generate the $N^{th}$ anterior corrected output signal;
- an $N^{th}$ posterior summing junction configured to subtract the $N^{th}$ posterior in-phase analog feedback signal and the $N^{th}$ posterior quadrature analog feedback signal from the $N^{th}$ anterior corrected output signal to generate an $N^{th}$ posterior input signal;
- an $N^{th}$ posterior resonator, having the $N^{th}$ resonant frequency, configured to receive the $N^{th}$ posterior corrected input signal and to generate the $N^{th}$ corrected output signal.

15. The circuit of claim 14, wherein
the first through $(N-1)^{th}$ filter stages each include
an $i^{th}$ frequency-shifting clock configured to generate an $i^{th}$ frequency-shifting clock signal;
an $i^{th}$ mixer configured to mix the $(i+1)^{th}$ corrected output signal and the $i^{th}$ frequency-shifting clock signal to generate an $i^{th}$ intermediate signal;
an $i^{th}$ anterior summing junction configured to subtract the $i^{th}$ anterior in-phase analog feedback signal and the $i^{th}$ anterior quadrature analog feedback signal from the $i^{th}$ intermediate signal to generate the $i^{th}$ anterior corrected input signal;
an $i^{th}$ anterior resonator, having an $i^{th}$ resonant frequency, configured to receive the $i^{th}$ anterior corrected input signal and to generate the $i^{th}$ anterior corrected output signal;
an $i^{th}$ posterior summing junction configured to subtract the $i^{th}$ posterior in-phase analog feedback signal and the $i^{th}$ posterior quadrature analog feedback signal from the $i^{th}$ anterior corrected output signal to generate the $i^{th}$ posterior corrected input signal; and
an $i^{th}$ resonator, having the $i^{th}$ resonant frequency, configured to receive the $i^{th}$ posterior corrected input signal and to generate the $i^{th}$ corrected output signal,
wherein i is an index value that varies from 1 to (N−1), and
wherein the first through $N^{th}$ resonant frequencies are all different.

16. A method for demodulating, digitizing a radio frequency signal, and providing a digital output signal, comprising:
receiving the radio frequency signal at an input frequency from an antenna;
generating first through $N^{th}$ analog feedback signals from the digital output signal, the first through $N^{th}$ analog feedback signals having first through $N^{th}$ feedback frequencies, respectively;
generating first through $(N-1)^{th}$ frequency-shifting clock signals, each of the first through $(N-1)^{th}$ frequency-shifting clock signals having a first through $(N-1)^{th}$ shifting frequency, respectively;
subtracting the $N^{th}$ analog feedback signal from the radio-frequency signal to generate an $N^{th}$ intermediate signal;
filtering the $N^{th}$ intermediate signal in an $N^{th}$ resonator, having an $N^{th}$ resonance frequency, to generate an $N^{th}$ analog output signal;
repeating for values of i descending from (N−1) to 1
generating an $i^{th}$ intermediate signal based on the $(i+1)^{th}$ analog output signal, the $i^{th}$ analog feedback signal, and the $i^{th}$ frequency-shifting clock signal, the $i^{th}$ intermediate signal having an $i^{th}$ intermediate frequency; and
filtering the $i^{th}$ intermediate signal in an $i^{th}$ resonator, having an $i^{th}$ resonance frequency, to generate an $i^{th}$ analog output signal; and
converting the first analog output signal into the digital output signal,
wherein N is an integer greater than 1,
wherein i is an index integer that varies between 1 and (N−1),
wherein each of the first through $N^{th}$ resonance frequencies are different, and
wherein for each value of i, the $i^{th}$ intermediate frequency is the same as the $i^{th}$ resonance frequency.

17. The method of claim 16, wherein the generating of the $i^{th}$ intermediate signal further comprises:

mixing the $i^{th}$ frequency-shifting clock signal with the $(i+1)^{th}$ analog output signal to generate an $i^{th}$ frequency-shifted signal; and
subtracting the $i^{th}$ analog feedback signal from the $i^{th}$ frequency shifted signal to generate the $i^{th}$ intermediate signal.

18. The method of claim 17, wherein the generating of the first through $N^{th}$ analog feedback signals further comprises:
generating first through $N^{th}$ feedback clocks, the first through $N^{th}$ feedback clocks having first through $N^{th}$ feedback frequencies, respectively;
mixing the digital output signal with the first through $N^{th}$ feedback clocks, respectively, to generate first through $N^{th}$ digital feedback signals; and
converting the first through $N^{th}$ digital feedback signals into the first through $N^{th}$ analog feedback signals, respectively,
wherein a $j^{th}$ feedback frequency is equal to the $j^{th}$ resonance frequency, and
wherein j is an index integer that varies from 1 to N.

19. The method of claim 16, wherein the generating of the $i^{th}$ intermediate signal further comprises:
subtracting the $i^{th}$ analog feedback signal from the $(i+1)^{th}$ output signal to generate an $i^{th}$ error-corrected signal; and
mixing the $i^{th}$ frequency-shifting clock signal with the $i^{th}$ error-corrected signal to generate the $i^{th}$ intermediate signal.

20. The method of claim 19, wherein the generating of the first through $N^{th}$ analog feedback signals further comprises:
generating first through $N^{th}$ feedback clocks, the first through $N^{th}$ feedback clocks having first through $N^{th}$ feedback frequencies, respectively;
mixing the digital output signal with the first through $N^{th}$ feedback clocks, respectively, to generate first through $N^{th}$ digital feedback signals; and
converting the first through $N^{th}$ digital feedback signals into the first through $N^{th}$ analog feedback signals, respectively,
wherein the $N^{th}$ feedback frequency is equal to the $N^{th}$ resonance frequency, and
wherein an $i^{th}$ feedback frequency is equal to the $(i+1)^{th}$ resonance frequency.

21. A method for demodulating, digitizing a radio frequency signal, and providing an in-phase digital output signal and a quadrature digital output signal, comprising:
receiving the radio frequency signal at an input frequency from an antenna;
generating first through $N^{th}$ in-phase analog feedback signals from the in-phase digital output signal, the first through $N^{th}$ in-phase analog feedback signals having first through $N^{th}$ in-phase feedback frequencies, respectively;
generating first through $N^{th}$ quadrature analog feedback signals from the quadrature digital output signal, the first through $N^{th}$ quadrature analog feedback signals having first through $N^{th}$ quadrature feedback frequencies, respectively;
generating first through $(N-1)^{th}$ frequency-shifting clock signals, each of the first through $(N-1)^{th}$ frequency-shifting clock signals having a first through $(N-1)^{th}$ shifting frequency, respectively;
subtracting the $N^{th}$ in-phase analog feedback signal and the $N^{th}$ quadrature analog feedback signal from the radio-frequency signal to generate an $N^{th}$ intermediate signal;

filtering the $N^{th}$ intermediate signal in an $N^{th}$ resonator, having an $N^{th}$ resonance frequency, to generate an $N^{th}$ analog output signal;

repeating for values of i descending from (N−1) to 1
generating an $i^{th}$ intermediate signal based on the $(i+1)^{th}$ analog output signal, the $i^{th}$ in-phase analog feedback signal, the $i^{th}$ quadrature analog feedback signal, and the $i^{th}$ frequency-shifting clock signal, the $i^{th}$ intermediate signal having an $i^{th}$ intermediate frequency; and
filtering the $i^{th}$ intermediate signal in an $i^{th}$ resonator, having an $i^{th}$ resonance frequency, to generate an $i^{th}$ analog output signal;

converting the first analog output signal at an in-phase output frequency into the in-phase digital output signal; and converting the first analog output signal at a quadrature output frequency into the quadrature digital output signal, the quadrature output frequency being ninety degrees out of phase with the in-phase output frequency, wherein N is an integer greater than 1, wherein i is an index integer that varies between 1 and (N−1), wherein each of the first through $N^{th}$ resonance frequencies are different, and wherein for each value of i, the $i^{th}$ intermediate frequency is the same as the $i^{th}$ resonance frequency.

22. The method of claim 21, wherein the generating of the $i^{th}$ intermediate signal further comprises:
mixing the $i^{th}$ frequency-shifting clock signal with the $(i+1)^{th}$ analog output signal to generate an $i^{th}$ frequency-shifted signal; and
subtracting the $i^{th}$ in-phase analog feedback signal and the $i^{th}$ quadrature analog feedback signal from the $i^{th}$ frequency shifted signal to generate the $i^{th}$ intermediate signal.

23. The method of claim 22, wherein the generating of the first through $N^{th}$ analog feedback signals further comprises:
generating first through $N^{th}$ in-phase feedback clocks, the first through $N^{th}$ feedback clocks having first through $N^{th}$ in-phase feedback frequencies, respectively;
generating first through $N^{th}$ quadrature feedback clocks, the first through $N^{th}$ feedback clocks having first through $N^{th}$ quadrature feedback frequencies, respectively, the first through $N^{th}$ quadrature feedback frequencies being ninety degrees out of phase with the first through $N^{th}$ in-phase feedback frequencies, respectively;
mixing the digital output signal with the first through $N^{th}$ in-phase feedback clocks, respectively, to generate first through $N^{th}$ in-phase digital feedback signals;
mixing the digital output signal with the first through $N^{th}$ quadrature feedback clocks, respectively, to generate first through $N^{th}$ quadrature digital feedback signals;
converting the first through $N^{th}$ in-phase digital feedback signals into the first through $N^{th}$ in-phase analog feedback signals, respectively; and
converting the first through $N^{th}$ quadrature digital feedback signals into the first through $N^{th}$ quadrature analog feedback signals, respectively,
wherein a $j^{th}$ in-phase feedback frequency is equal to the $j^{th}$ resonance frequency, and
wherein j is an index integer that varies from 1 to N.

24. The method of claim 21, wherein the generating of the $i^{th}$ intermediate signal further comprises:
subtracting the $i^{th}$ in-phase analog feedback signal and the $i^{th}$ quadrature analog feedback signal from the $(i+1)^{th}$ output signal to generate an $i^{th}$ error-corrected signal; and mixing the $i^{th}$ frequency-shifting clock signal with the $i^{th}$ error-corrected signal to generate the $i^{th}$ intermediate signal.

25. The method of claim 24, wherein the generating of the first through $N^{th}$ analog feedback signals further comprises:
generating first through $N^{th}$ in-phase feedback clocks, the first through $N^{th}$ feedback clocks having first through $N^{th}$ in-phase feedback frequencies, respectively;
generating first through $N^{th}$ quadrature feedback clocks, the first through $N^{th}$ feedback clocks having first through $N^{th}$ quadrature feedback frequencies, respectively, the first through $N^{th}$ quadrature feedback frequencies being ninety degrees out of phase with the first through $N^{th}$ in-phase feedback frequencies, respectively;
mixing the digital output signal with the first through $N^{th}$ in-phase feedback clocks, respectively, to generate first through $N^{th}$ in-phase digital feedback signals;
mixing the digital output signal with the first through $N^{th}$ quadrature feedback clocks, respectively, to generate first through $N^{th}$ quadrature digital feedback signals;
converting the first through $N^{th}$ in-phase digital feedback signals into the first through $N^{th}$ in-phase analog feedback signals, respectively; and
converting the first through $N^{th}$ quadrature digital feedback signals into the first through $N^{th}$ quadrature analog feedback signals, respectively,
wherein the $N^{th}$ in-phase feedback frequency is equal to the $N^{th}$ resonance frequency, and
wherein an $i^{th}$ in-phase feedback frequency is equal to the $(i+1)^{th}$ resonance frequency.

26. A method for demodulating, digitizing a radio frequency signal, and providing an in-phase digital output signal and a quadrature digital output signal, comprising:
receiving the radio frequency signal at an input frequency from an antenna;
generating first through $N^{th}$ anterior in-phase analog feedback signals and first through $N^{th}$ posterior in-phase analog feedback signals from the in-phase digital output signal, the first through $N^{th}$ anterior in-phase analog feedback signals and the first through $N^{th}$ posterior in-phase analog feedback signals having first through $N^{th}$ in-phase feedback frequencies, respectively;
generating first through $N^{th}$ anterior quadrature analog feedback signals and first through $N^{th}$ posterior quadrature analog feedback signals from the quadrature digital output signal, the first through $N^{th}$ anterior quadrature analog feedback signals and the first through $N^{th}$ posterior quadrature analog feedback signals having first through $N^{th}$ quadrature feedback frequencies, respectively;
generating first through $(N-1)^{th}$ frequency-shifting clock signals, each of the first through $(N-1)^{th}$ frequency-shifting clock signals having a first through $(N-1)^{th}$ shifting frequency, respectively;
subtracting the $N^{th}$ anterior in-phase analog feedback signal and the $N^{th}$ anterior quadrature analog feedback signal from the radio-frequency signal to generate an $N^{th}$ anterior intermediate signal;
filtering the $N^{th}$ anterior intermediate signal in an $N^{th}$ anterior resonator, having an $N^{th}$ resonance frequency, to generate an $N^{th}$ anterior analog output signal;
subtracting the $N^{th}$ posterior in-phase analog feedback signal and the $N^{th}$ posterior quadrature analog feedback signal from the $N^{th}$ anterior analog signal to generate an $N^{th}$ posterior intermediate signal;

filtering the $N^{th}$ posterior intermediate signal in an $N^{th}$ posterior resonator, having the $N^{th}$ resonance frequency, to generate an $N^{th}$ posterior analog output signal;

repeating for values of i descending from (N−1) to 1
   mixing the $(i+1)^{th}$ posterior analog output signal with the $i^{th}$ frequency-shifting clock signal to generate an $i^{th}$ frequency-shifted signal;
   subtracting the $i^{th}$ anterior in-phase analog feedback signal and the $i^{th}$ anterior quadrature analog feedback signal from the $(i+1)^{th}$ posterior analog output signal to generate an $i^{th}$ anterior intermediate signal, the $i^{th}$ intermediate signal having an $i^{th}$ intermediate frequency; and
   filtering the $i^{th}$ anterior intermediate signal in an $i^{th}$ anterior resonator, having an $i^{th}$ resonance frequency, to generate an $i^{th}$ anterior analog output signal;
   subtracting the $i^{th}$ posterior in-phase analog feedback signal and the $i^{th}$ posterior quadrature analog feedback signal from the $i^{th}$ anterior analog output signal to generate an $i^{th}$ posterior intermediate signal, the $i^{th}$ posterior intermediate signal having the $i^{th}$ intermediate frequency; and
   filtering the $i^{th}$ posterior intermediate signal in an $i^{th}$ posterior resonator, having the $i^{th}$ resonance frequency, to generate an $i^{th}$ posterior analog output signal;

converting the first posterior analog output signal at an in-phase output frequency into the in-phase digital output signal; and converting the first posterior analog output signal at a quadrature output frequency into the quadrature digital output signal, the quadrature output frequency being ninety degrees out of phase with the in-phase output frequency, wherein N is an integer greater than 1, wherein i is an index integer that varies between 1 and (N−1), wherein each of the first through $N^{th}$ resonance frequencies are different, and wherein for each value of i, the $i^{th}$ intermediate frequency is the same as the $i^{th}$ resonance frequency.

27. The method of claim 16, further comprising:

generating M in-phase feedback signals from a digital in-phase output signal;

generating M quadrature feedback signals from a digital quadrature output signal;

generating a down-converted in-phase signal by multiplying the digital output signal with an in-phase clock;

generating a down-converted quadrature signal by multiplying the digital output signal with a quadrature clock, the quadrature clock being ninety degrees out of phase with the in-phase clock;

generating an $M^{th}$ in-phase error signal responsive to a difference between the in-phase down-converted signal and the $M^{th}$ in-phase feedback signal;

generating an $M^{th}$ quadrature error signal responsive to a difference between the quadrature down-converted signal and the $M^{th}$ quadrature feedback signal;

amplifying and low pass filtering the $M^{th}$ in-phase error signal at an $M^{th}$ in-phase low pass filter to generate an $M^{th}$ in-phase filtered signal;

amplifying and low pass filtering the $M^{th}$ quadrature error signal at an $M^{th}$ quadrature low pass filter to generate an $M^{th}$ quadrature filtered signal;

repeating for values of i descending from (M−1) to 1
   generating an $i^{th}$ in-phase error signal responsive to the difference between the $(i+i)^{th}$ in-phase phase filtered signal and the $i^{th}$ in-phase feedback signal;
   generating an $i^{th}$ quadrature error signal responsive to the difference between the $(i+1)^{th}$ quadrature filtered signal and the $i^{th}$ quadrature feedback signal;
   amplifying and low pass filtering the $i^{th}$ in-phase error signal at an $i^{th}$ in-phase low pass filter to generate an $i^{th}$ in-phase filtered signal;
   amplifying and low pass filtering the $i^{th}$ quadrature error signal at an $i^{th}$ quadrature low pass filter to generate an $i^{th}$ quadrature filtered signal;

producing the digital in-phase output signal by over-sampling and digitizing the first in-phase filtered signal using the in-phase clock; and producing the digital quadrature output signal by over-sampling and digitizing the first quadrature filtered signal using the in-phase clock, wherein M is an integer greater than 1, and wherein i is an index integer that varies between 1 and (M−1).

* * * * *